United States Patent [19]
Rogers et al.

[11] Patent Number: 5,510,733
[45] Date of Patent: Apr. 23, 1996

[54] HIGH SPEED CIRCUIT WITH CMOS AND BIPOLAR LOGIC STAGES

[75] Inventors: Alan C. Rogers; Bradley M. Davidson, both of Palo Alto, Calif.

[73] Assignee: Sun Microsystems, Inc.

[21] Appl. No.: 363,729

[22] Filed: Dec. 23, 1994

[51] Int. Cl.$^6$ .................................................. H03K 19/173
[52] U.S. Cl. .............................. 326/110; 326/43; 326/44
[58] Field of Search .................................. 326/110, 42–44

[56] References Cited

U.S. PATENT DOCUMENTS

| | | | |
|---|---|---|---|
| 4,661,728 | 4/1987 | Kashimura | 326/44 |
| 4,725,745 | 2/1988 | Kondo et al. | 326/42 |
| 4,789,797 | 12/1988 | Vasseghi | 326/42 |
| 4,987,326 | 1/1991 | Satoh | 326/43 |

*Primary Examiner*—Edward P. Westin
*Assistant Examiner*—Andrew Sanders

*Attorney, Agent, or Firm*—Flehr, Hohbach, Test, Albritton & Herbert

[57] ABSTRACT

An integrated circuit includes a bipolar logic stage and a CMOS logic stage. The bipolar logic stage includes a common emitter line positioned along a central axis, and a set of bipolar signal drive blocks arranged along the central axis. Each of the bipolar signal drive blocks includes a bipolar transistor with an emitter connected to the common emitter line. Each of the bipolar signal drive blocks further includes an emitter-base reverse voltage protection device. The CMOS logic stage includes a plurality of CMOS logic blocks connected to the set of bipolar signal drive blocks. The CMOS logic blocks are arranged in a compact configuration that is substantially perpendicular to the central axis. The CMOS logic stage performs logical operations on a set of input signals to generate a set of intermediate signals that are driven by the set of bipolar signal drive blocks onto the common emitter line. The common emitter line executes a hardwired logical OR operation on the intermediate signals to produce a high speed output signal.

16 Claims, 8 Drawing Sheets

HIGH SPEED CIRCUIT WITH CMOS AND BIPOLAR LOGIC STAGES

BRIEF DESCRIPTION OF THE INVENTION

This invention relates generally to integrated circuits. More particularly, this invention relates to an integrated circuit with a configuration of CMOS and bipolar logic stages that achieves high processing speeds.

BACKGROUND OF THE INVENTION

CMOS transistors are used to implement a variety of complex logical operations. Attempts have been made to improve the speed of CMOS circuits by integrating bipolar transistors into CMOS circuits. Specifically, emitter coupled logic has been used in CMOS circuits for high speed operations. Emitter coupled logic is usually implemented with differential gates responding to small current swings. In contrast, CMOS circuits operate on a rail-to-rail (low-to-high voltage) basis. Thus, attempts to integrate bipolar logic into CMOS circuits have resulted in extra delays as conversions are made from the CMOS rail-to-rail domain to the emitter coupled logic differential domain. The delays associated with the conversions essentially negate any speed advantages otherwise provided by the use of bipolar circuits.

Thus, it would be highly desirable to provide a CMOS circuit that exploits the speed advantages of bipolar logic, without imposing conversion overhead between the CMOS and bipolar domains.

SUMMARY OF THE INVENTION

The invention is an integrated circuit with a bipolar logic stage and a CMOS logic stage. The bipolar logic stage includes a common emitter line positioned along a central axis, and a set of bipolar signal drive blocks arranged along the central axis. Each of the bipolar signal drive blocks includes a bipolar transistor with an emitter connected to the common emitter line. Each of the bipolar signal drive blocks further includes an emitter-base reverse voltage protection device. The CMOS logic stage includes a plurality of CMOS logic blocks connected to the set of bipolar signal drive blocks. The CMOS logic blocks are arranged in a compact configuration that is substantially perpendicular to the central axis. The CMOS logic stage performs logical operations on a set of input signals to generate a set of intermediate signals that are driven by the set of bipolar signal drive blocks onto the common emitter line. The common emitter line executes a hardwired logical OR operation on the intermediate signals to produce a high speed output signal.

The circuit of the invention can achieve storage element delays (data-to-output) around 150 picoseconds and high functionality gate delays in several hundreds of picoseconds. Thus, microprocessors using this technology can have an operating frequency in the high hundreds of megahertz to low gigahertz region.

The speed advantages of the technology are attributable to a number of factors. Generally, there is a successful integration of CMOS and bipolar technologies. In addition, the emitters of the transistors in the bipolar signal drive block share the common emitter line to reduce area and parasitic capacitances. The drains of the transistors in the CMOS logic blocks are shared to reduce capacitance. The compact and uniform configuration of the bipolar signal drive blocks and CMOS logic blocks also results in low parasitics. The invention is also advantageous because it can be implemented using current production processes.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
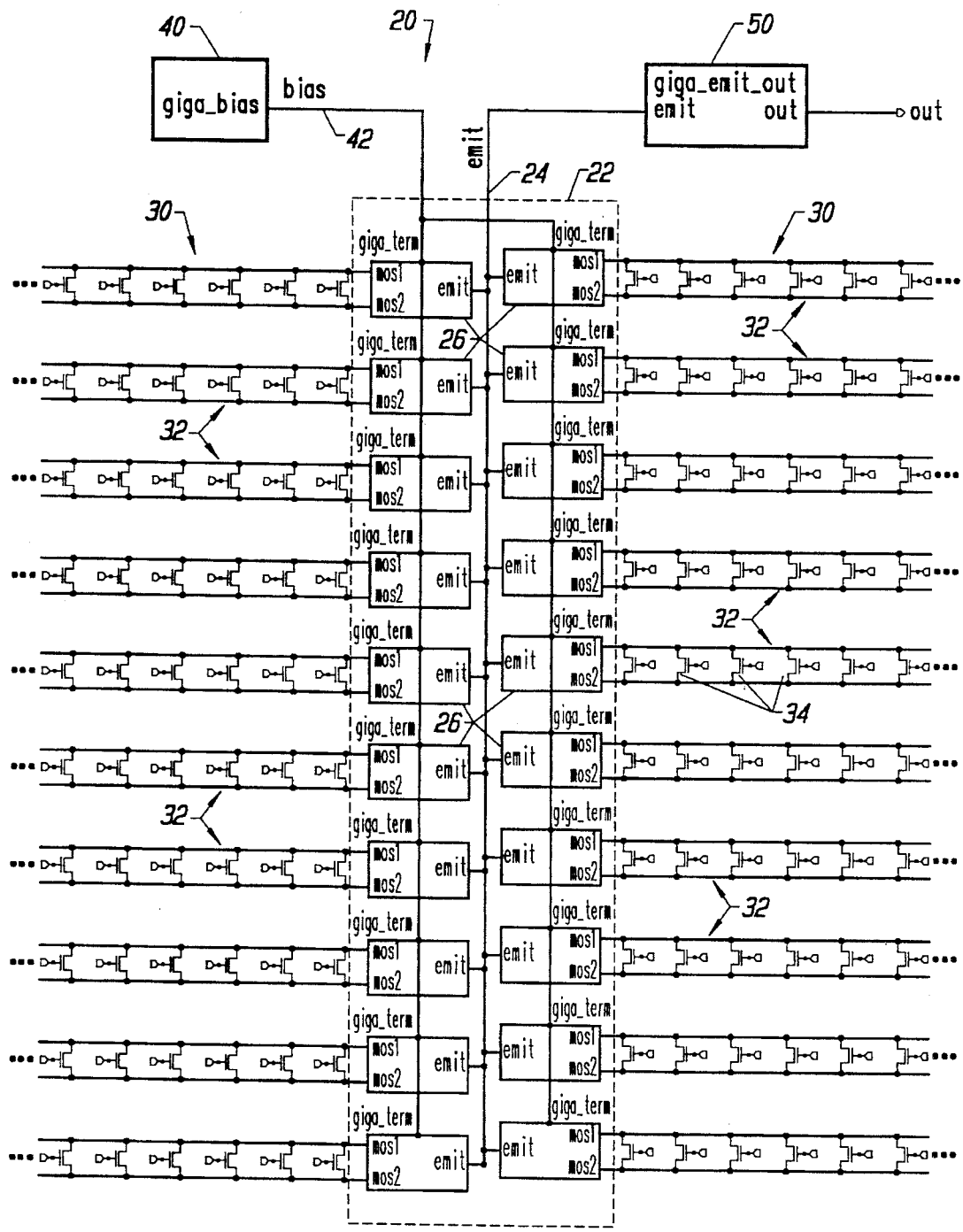
FIG. 1 is a schematic of a high speed circuit with CMOS and bipolar logic stages, in accordance with one embodiment of the present invention.

FIG. 1 is a schematic of a circuit 20 with CMOS and bipolar logic stages configured in accordance with one embodiment of the present invention. The bipolar logic stage 22 includes a common emitter line 24 and a set of bipolar signal drive blocks 26. The CMOS logic stage 30 includes CMOS logic blocks 32 that are arranged substantially perpendicular to the common emitter line 24. Each CMOS logic block 32 includes a set of parallel transistors 34.

FIG. 1 illustrates that the circuit 20 further includes a bias circuit 40. The bias circuit 40 is connected to a bias output line 42 that is connected to each of the bipolar signal drive blocks 26. The circuit 20 also includes an output driver 50 connected to the common emitter line 24.

Input signals are applied to the individual transistors 34 of the CMOS logic blocks 32. The CMOS logic stage 30 includes a uniform array of CMOS logic blocks 32, as shown in FIG. 1. The uniform array simplifies design and fabrication of the circuit. Although a uniform CMOS logic stage 30 physical configuration is provided, only selected transistors are typically used within the CMOS logic stage 30. As a result, the circuit 20 of the invention is analogous to a programmable logic array.

The input signals are processed by the CMOS logic blocks 32 to produce a set of intermediate signals that are applied to the bipolar signal drive blocks 26. More particularly, each CMOS logic block 32 generates an intermediate signal that is applied to a bipolar signal drive block 26. The bipolar signal drive block 26 provides high speed and high drive processing of the intermediate signal that is then applied to the common emitter line 24. The common emitter line 24 effectively executes a hardwired logical OR operation on the intermediate signals received from the bipolar signal drive blocks 26. That is, if any intermediate signal from the bipolar signal drive blocks 26 is high, then the output signal on the common emitter line 24 will be high. The output signal on the common emitter line is driven by output driver 50, as will be described below.

Some of the benefits of the present invention are immediately cognizable from this general overview of the schematic of FIG. 1. First, the common emitter line 24 reduces area and parasitic capacitances. Next, it can be seen that the drain of each transistor 34 of the CMOS logic blocks 32 shares a common line to reduce capacitance, thereby improving speed. The compact and uniform configuration of the bipolar signal drive blocks 26 and CMOS logic blocks 32 also results in low parasitics.

Figure 2:
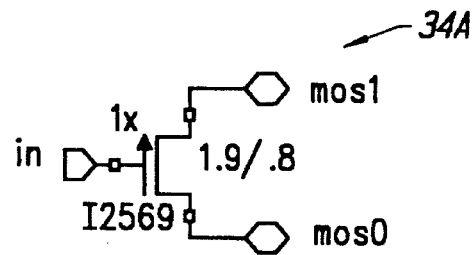
FIG. 2 is a schematic of an NMOS transistor that can be used in the circuit of FIG. 1.

The features and benefits of the invention will be more fully appreciated with reference to the remaining figures. FIG. 2 illustrates an NMOS transistor 34A that may be used in the CMOS logic blocks 32. The invention is disclosed in relation to CMOS technology, which is the preferable embodiment, however it should be appreciated that the techniques of the invention are equally applicable to any other Metal Oxide Semiconductor (MOS) technology. Thus, any reference herein to CMOS technology contemplates any MOS technology.

The transistor 34A of FIG. 2 includes an input node ("in") for receiving an input signal, a source node ("mos1"), and a drain node ("mos0"). The 1.9 value in the figure specifies the width in microns for one embodiment of the transistor. The 0.8 value in the figure specifies the length in microns of the gate for one embodiment.

Figure 3:
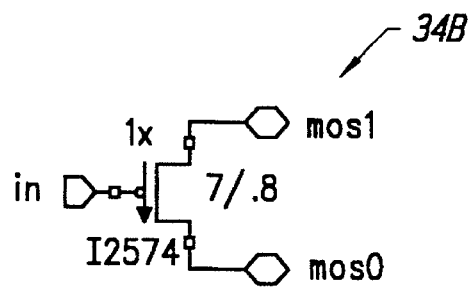
FIG. 3 is a schematic of a PMOS transistor that can be used in the circuit of FIG. 1.

FIG. 3 illustrates a PMOS transistor 34B that may be used in the CMOS logic blocks 32. The PMOS transistor 34B is used for inverting input signals. The transistor 34B of FIG. 3 includes an input node ("in") for receiving an input signal, a source node ("mos1"), and a drain node ("mos0"). The 7 value in the figure specifies the width in microns for one embodiment of the transistor. The width is larger than that of the NMOS device because the PMOS device is less conductive. The 0.8 value in the figure specifies the length in microns of the gate for one embodiment.

As previously indicated, the transistors of FIGS. 2 and 3 are placed in the CMOS logic blocks 32. FIG. 1 shows a subset (as indicated by the dots at the end of each logic block 32) of the transistors used in one embodiment of the invention. Specifically, the invention was implemented using ten NMOS transistors and four PMOS transistors in each CMOS logic block 32. If any transistor is turned on in a CMOS logic block 32, then the "mos1" node is pulled down (digital low). That is, if a high input signal is applied to the "in" node of the transistor in FIG. 2, then the "mos1" node is pulled down as the transistor turns on. Similarly, if a low input signal is applied to the "in" node of the transistor of FIG. 3 (which is otherwise tied to a high value, say by an inverter, to keep it turned off), then the "mos1" node is pulled down as the transistor turns on. Thus, each CMOS logic block 32 of FIG. 1 performs a logical NOR function on all inputs.

Returning now to FIG. 1, it can be seen that there are twenty bipolar signal drive blocks 26. Each block 26 may be implemented using the circuit of FIG. 4. The inputs to the circuit 26 are the bias circuit output line 42 and the "mos1" and "mos0" line of a CMOS logic block 32. The output of the circuit is the "emit" node which is tied to the common emitter line 24.

Figure 4:
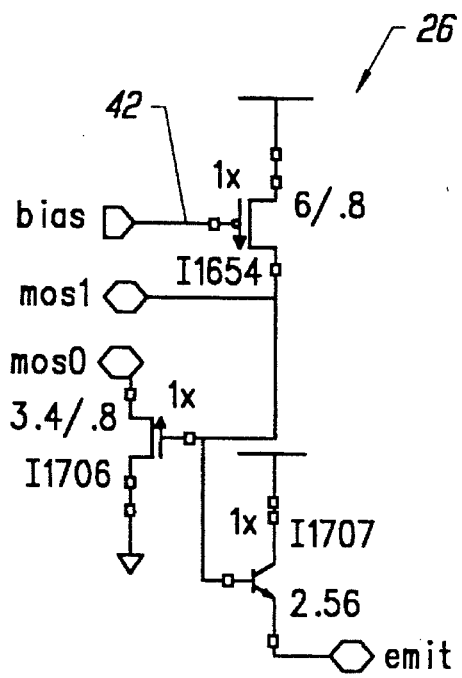
FIG. 4 is a schematic of a bipolar signal drive block, in accordance with one embodiment of the present invention.

Transistor I1654 of FIG. 4 is a bias pull up transistor which serves to keep node "mos1" high. The gate of the transistor receives a signal from the bias circuit output line 42 which alters the gate drive of the circuit to account for manufacturing variations. When the "mos1" node is high, bipolar transistor I1707 is turned on, driving a high signal onto the "emit" node. However, if one of the CMOS transistors 34 pulls the "mos1" node low, then the bipolar transistor 1707 shuts off, permitting the "emit" node to have a low signal.

Bipolar transistor I1707 is connected to an emitter-base reverse voltage protection device, which is implemented in this embodiment as transistor I1706. As its name implies, the emitter-base reverse voltage protection device is used to prevent voltage transients across transistor I1707. Transients can occur if there is a high signal on the common emitter line 24 and the base is at ground potential. The emitter-base reverse voltage protection device significantly improves the useful life of the bipolar transistor I1707, and otherwise provides a successful interface to execute emitter coupled logic off CMOS gates.

The emitter-base reverse voltage protection device prevents the base of bipolar transistor I1707 from going all the way to ground potential. That is, the base is clamped at a voltage corresponding to the threshold voltage of transistor I1706, which is approximately 1 volt. This reduces, by approximately 1 volt, the maximum reverse bias on the bipolar transistor I1707. Thus, in one embodiment of the invention, an emitter-base reverse voltage protection device operates by reducing the maximum reverse bias that can exist on the bipolar transistor of the bipolar signal drive block.

Figure 5:
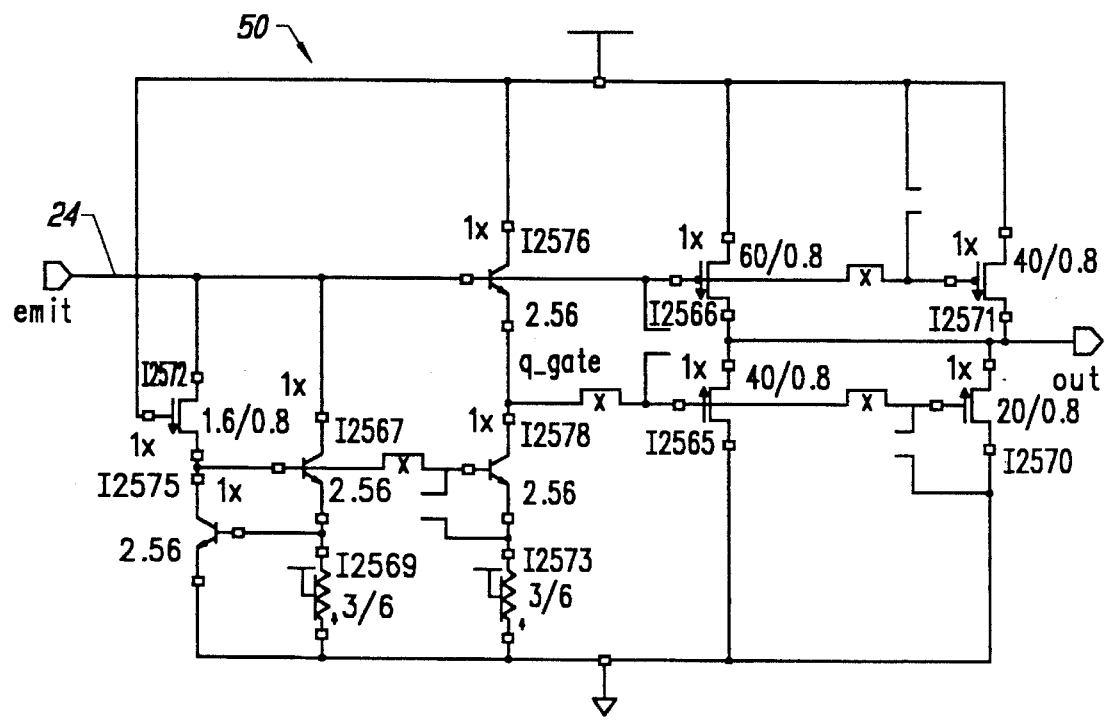
FIG. 5 is a schematic of an output driver, in accordance with one embodiment of the present invention.

FIG. 5 illustrates an output driver 50 that may be used in accordance with the circuit of FIG. 1. In its simplest form, the output driver 50 is an inverter. Recall that the CMOS logic blocks 32 perform a logical NOR operation, the common emitter line 24 performs a logical OR operation and the output driver 50 performs an inversion operation. According to DeMorgan's Theorem, this operation is equivalent to sequential logical OR and AND operations. In one implementation, the circuit of FIG. 1 uses these operations to assess whether a data cache is busy.

The input to the output driver 50 is the signal from common emitter line 24. Transistors I2572, I2575, and I2567 operate as a constant current pull down. Transistor I2572 supplies base current to transistor I2567. As a result, transistor I2567 turns on and pulls the node "emit" low. The emitter of transistor I2567 supplies base current to transistor I2575. When transistor I2575 turns on, it pulls current away from the base of I2567, thereby giving a negative feedback to achieve a constant current pull down. Transistor I2578 operates in a manner consistent with transistor I2567.

The output driver 50 also includes an amplification stage. The amplification stage includes a pull up stage with two PMOS drivers, transistors I2566 and I2571, which are directly driven off the node "emit". The two PMOS drivers provide a digital high signal in response to a low input signal on the "emit" node.

The amplification stage of the output driver 50 also has two NMOS drivers, transistors I2565 and I2570. The two NMOS drivers pull down the node "out" to provide a digital low signal output signal. The NMOS drivers are isolated by transistor I2576. Isolation transistor I2576 serves to take the load of the NMOS drivers off the "emit" node. This is done to increase the speed of the common emitter line 24.

Figure 6:
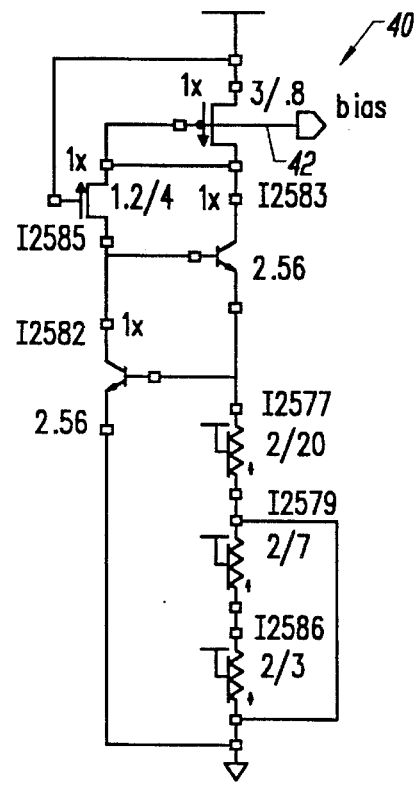
FIG. 6 is a schematic of a bias circuit, in accordance with one embodiment of the present invention.

The final component of the circuit of FIG. 1 is the bias circuit. A suitable bias circuit 40 is illustrated in FIG. 6. The bias circuit serves as a constant current source for the bipolar logic blocks 26. This is achieved as transistor I2585 supplies a base current to the base of bipolar transistor I2583, causing it to turn on. If the output on the emitter of transistor I2583 gets too high, transistor I2582 turns on, thereby limiting base current to I2583, effectively providing a negative feedback. As a result, the collector of transistor I2583 is modulated, which in turn modulates the bias signal on the node "bias".

One embodiment of the invention has now been described. Attention presently turns to FIG. 7, an alternate embodiment of the invention. The circuit 120 of FIG. 7 includes a bipolar logic stage 122. As in case of the circuit of FIG. 1, the bipolar logic stage 122, includes a common emitter line 124 connected to a set of bipolar signal drive blocks 126.

The circuit 120 also includes a CMOS logic stage 130, including a portion 130A to the left of the common embitter line 124, and a portion 130B to the right of the common emitter line 124. Each portion of the CMOS logic stage 130 includes a set of CMOS logic blocks 132. As in case of the circuit 20 of FIG. 1, circuit 120 of FIG. 7 includes a bias circuit 140 and an output driver 150.

Figure 7:
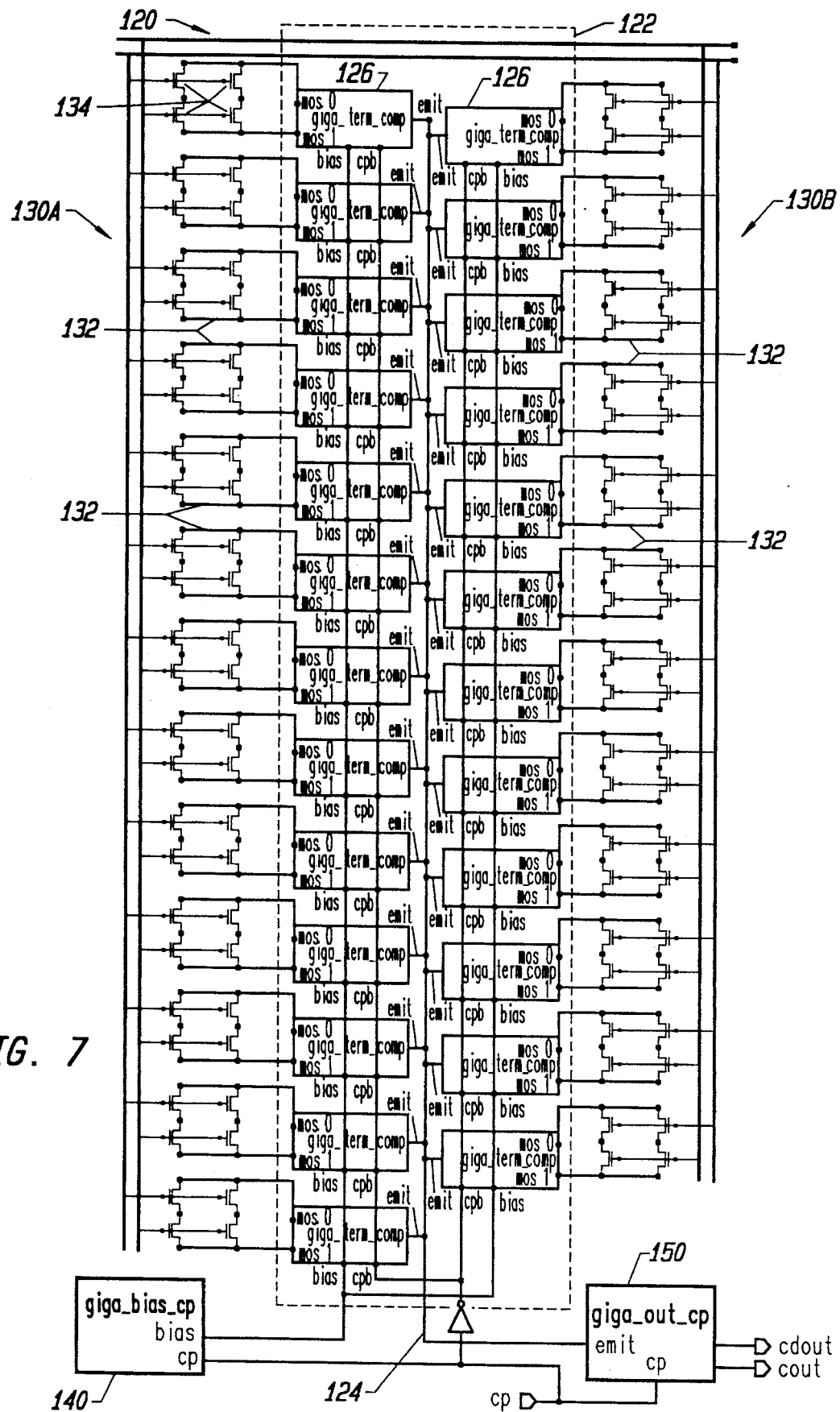
FIG. 7 is a schematic of a high speed circuit with CMOS and bipolar logic stages, in accordance with one embodiment of the present invention.

It should be noted that the advantageous features of the circuit of FIG. 1 also exist in the circuit of FIG. 7. Specifically, the circuit of FIG. 7 has a common emitter line 124 to reduce area and parasitic capacitance. In addition, the compact and uniform configuration of the bipolar signal drive blocks 126 and CMOS logic blocks 132 results in low parasitics.

Figure 8:
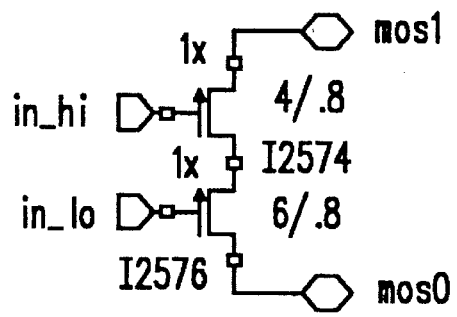
FIG. 8 is a schematic of serial NMOS transistors that may be used to perform an exclusive OR operation in accordance with the circuit of FIG. 7.
Figure 9:
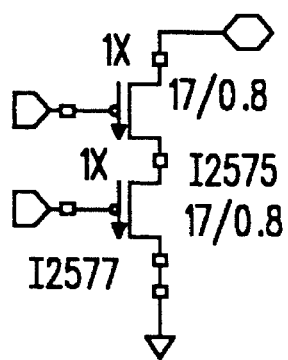
FIG. 9 is a schematic of serial PMOS transistors that may be used to perform an exclusive OR operation in accordance with the circuit of FIG. 7.

Each CMOS logic block 132 executes a logical exclusive-OR operation (the output is high only when one of the two inputs is high). FIG. 8 illustrates two serial NMOS transistors, while FIG. 9 illustrates two serial PMOS transistors. As shown in FIG. 7, the serial NMOS transistors of FIG. 8 are used in combination with the serial PMOS transistors of FIG. 9. The serial NMOS transistors of FIG. 8 pull node "mos1" low only when both inputs "in_hi" and "in_lo" are high. Similarly, the serial PMOS transistors of FIG. 9 pull node "mos1" low only when both inputs "in_hi" and "in_lo" are low. This configuration results in an exclusive-OR operation.

Figure 10:
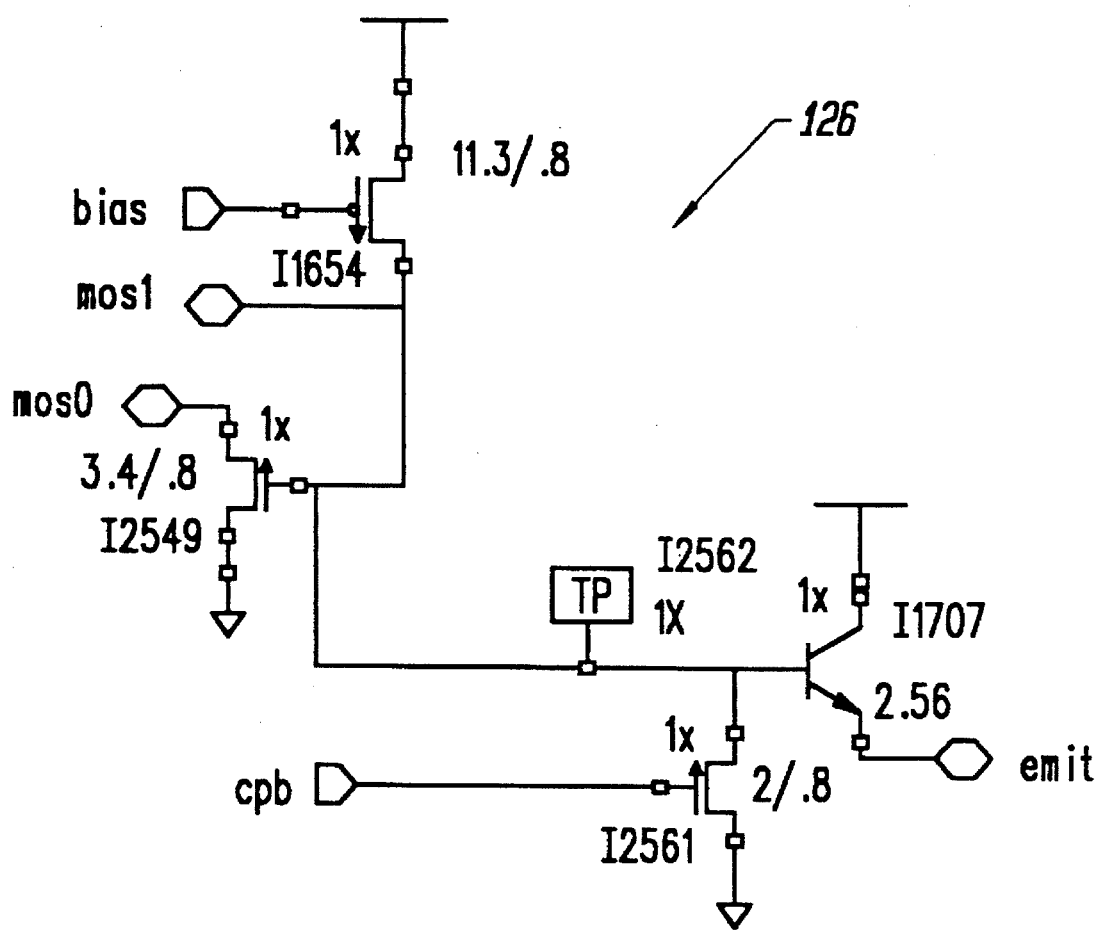
FIG. 10 is a schematic of a bipolar signal drive block, in accordance with one embodiment of the present invention.

FIG. 10 illustrates a bipolar signal drive block 126. The circuit operates in the same manner as the circuit of FIG. 4. However, the circuit also includes a node labeled "cpb". When a high signal is applied to node "cpb", transistor I2561 is turned on, pulling down the base of transistor I1707, causing transistor I1707 to completely shut off and conserve power.

Figure 11:
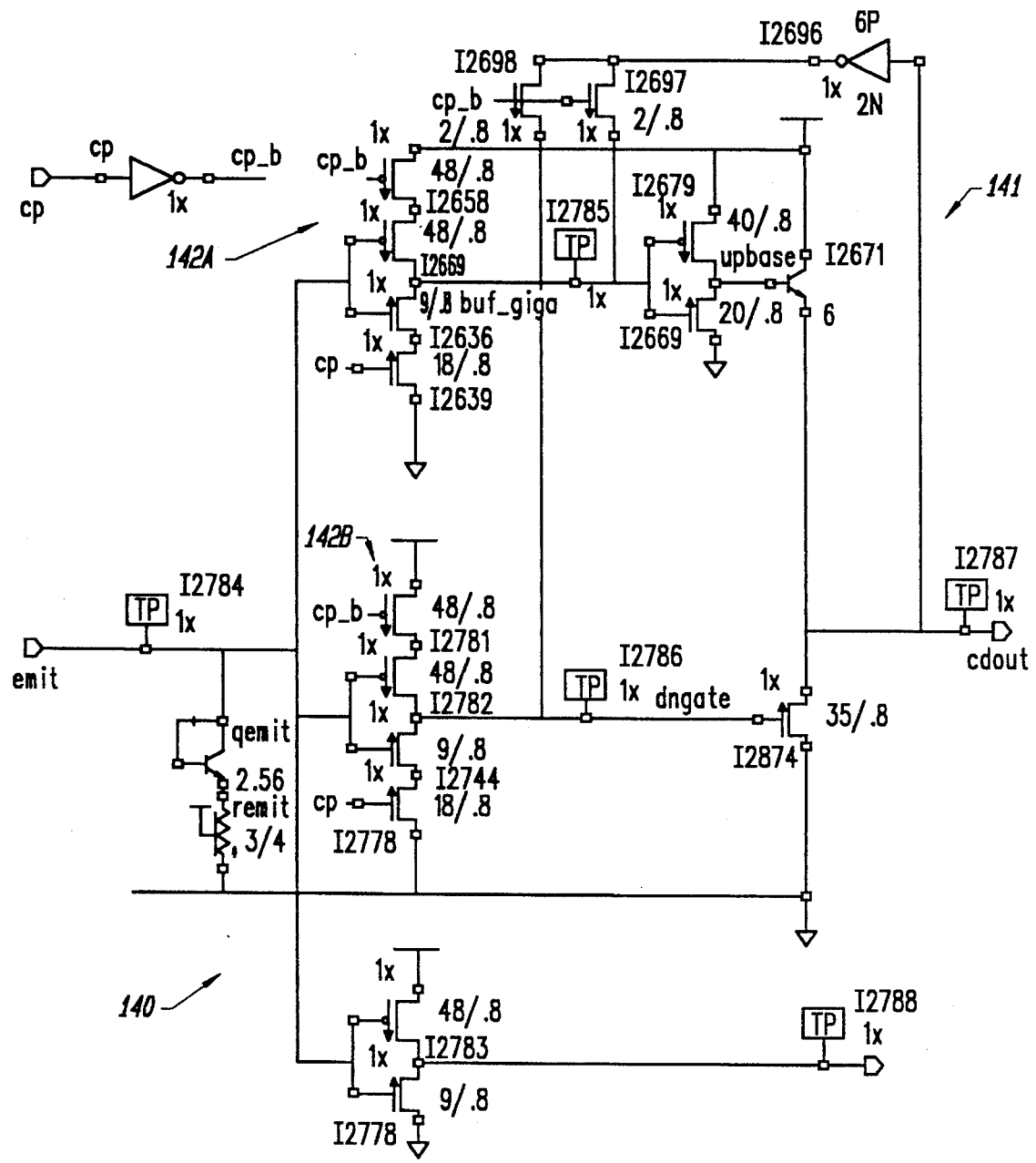
FIG. 11 is a schematic of an output driver, in accordance with one embodiment of the present invention.

FIG. 11 illustrates the output driver 140 that may be used with the circuit of FIG. 7. The output driver 140 includes a constant current source pull down transistor "qemit". The emitter of transistor qemit includes a resistor "remit" to limit current. The signal on node "emit" is inverted by a standard inverter configuration including transistors I2778 and I2783 to produce an inverted output signal on node "cout".

The output driver 140 includes a latching circuit 141. The latching circuit stores the value on the "cdout" node. The latching circuit 141 includes a serial circuit stack 142A. The serial circuit stack 142A includes an NMOS transistor I2636 and a PMOS transistor I2660 which form an inverter. There is a PMOS transistor I2658 on the top side of the inverter with its gate tied to a "cp_b" node. There is also an NMOS transistor I2659 on the bottom side of the inverter with its gate tied to a "cp" node. A similar configuration exists for serial circuit stack 142B.

When the "cp" node is high (and the "cp_b" node is low), the signal on the "emit" node will be processed by the inverter portion of the serial circuit stacks 142A and 142B. The inverted emit signal will appear on the "bu_giga" and "dngate" nodes. Transistor I2674 acts as a pull down device. Transistor I2671 acts as a pull up device, being driven by the inverter comprising stacked transistors I2679 and I2689. As a result, the "cdout" node follows the "emit" node signal.

When the "cp" node is low (and the "cp_b" node is high), the signal on the "cdout" node is held by the latch circuit 141. The low signal on the "cp" node disables the inverter portion of each serial circuit stack 142A and 142B. The signal on the "cdout" node is then passed to inverter I2696. The high signal on the "cp_b" node turns on transistors I2698 and I2697, allowing the output of the inverter to be passed to the "buf_giga" node and "dngate" node, where it is held. Thus, the signal from the "cdout" node is preserved until it is processed when the "cp" signal is toggled.

Figure 12:
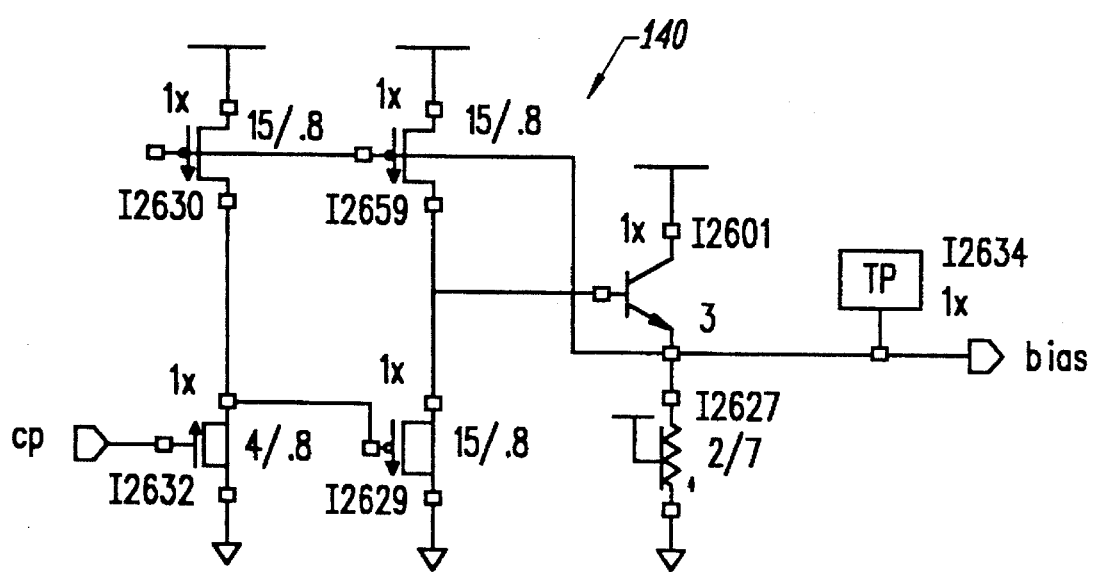
FIG. 12 is a schematic of a bias circuit, in accordance with one embodiment of the present invention.

FIG. 12 illustrates a bias circuit 140. When the "cp" input is low, transistor I2632 is off, which results in transistor I2629 being shut off as its gate receives a signal through transistor I2630. Since I2629 is shut off, the base of transistor I2601 receives a base signal through transistor I2597, forcing the node "bias" to carry a high signal. As seen in FIG. 10, when the bias node is high, PMOS transistor I1654 is turned off. When the "cp" input is high, transistor I2632 is on, thereby pulling the gate of transistor I2629 low and forcing transistor I2629 on. Transistor I2629 then pulls the base of transistor I2601 low, forcing the output signal on the "bias" node low.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

We claim:

1. An integrated circuit comprising:

a bipolar logic stage including a common emitter line positioned along an axis, and a plurality of bipolar signal drive blocks arranged along said axis, each of said bipolar signal drive blocks including a bipolar transistor with an emitter connected to said common emitter line, each of said bipolar signal drive blocks further including an emitter-base reverse voltage protection device; and a MOS logic stage including a plurality of MOS logic blocks connected to said plurality of bipolar signal drive blocks, said MOS logic stage performing logical operations on a set of input signals to generate a set of intermediate signals that are driven by said plurality of bipolar signal drive blocks onto said common emitter line that executes a hardwired logical OR operation on said intermediate signals to produce a high speed output signal.

2. The integrated circuit of claim 1 further comprising a bias circuit with a bias output line connected to said plurality of bipolar logic blocks, said bias circuit providing a bias signal on said bias output line to bias said bipolar transistors of said signal drive blocks.

3. The integrated circuit of claim 2 wherein said bias circuit includes a disable signal node to disable the output of said bias circuit.

4. The integrated circuit of claim 1 further comprising an output driver connected to said common emitter line.

5. The integrated circuit of claim 4 wherein said output driver includes a constant current pull down stage and an amplification stage.

6. The integrated circuit of claim 5 wherein said constant current pull down stage includes a first MOS transistor with a gate node and source node connected to an input node of said output driver, a drain node of said first MOS transistor providing a base signal;

a primary bipolar transistor with a primary base node connected to said drain node of said first MOS transistor to receive said base signal, a primary collector node connected to said input node of said output driver, and a primary emitter node, said primary emitter node receiving an emitter signal in response to said base signal; and a feedback bipolar transistor with a feedback base node connected to said primary emitter node and a feedback collector node connected to said primary base node, said emitter signal turning said feedback bipolar transistor on to limit said base signal and thereby provide feedback control to said primary bipolar transistor.

7. The integrated circuit of claim 5 wherein said amplification stage includes a pull up stage;

a pull down stage; and an isolating transistor between said pull down stage and the input node of said output driver.

8. The integrated circuit of claim 5 wherein said constant current pull down stage includes a single bipolar transistor with a base node and a collector node connected to the input node of said output driver.

9. The integrated circuit of claim 5 wherein said amplification stage includes a latching circuit to hold a signal on the input node of said output driver.

10. The integrated circuit of claim 1 wherein said emitter-base reverse voltage protection device is a transistor connected to a base node of said bipolar transistor to prevent said base node from going to ground potential.

11. The integrated circuit of claim 1 wherein each of said bipolar logic blocks includes a pull down transistor connected to a base node of said bipolar transistor to completely shut off said bipolar transistor.

12. A method of constructing a dedicated logic region of an integrated circuit, said method comprising the steps of:

providing a bipolar logic stage including a common emitter line positioned along an axis, and a plurality of bipolar logic blocks arranged along said axis, each of said bipolar logic blocks including a bipolar logic gate with an emitter connected to said common emitter line, each of said bipolar logic blocks further including an emitter-base reverse voltage protection device; and providing a MOS logic stage including a plurality of MOS logic blocks connected to said plurality of bipolar logic blocks, said MOS logic stage performing logical operations on a set of input signals to generate a set of intermediate signals that are driven by said plurality of bipolar signal drive blocks onto said common emitter line that executes a hardwired logical OR operation on said intermediate signals to produce a high speed output signal.

13. The method of claim 12 further comprising the step of integrating said dedicated logic region into a microprocessor.

14. The method of claim 13 further comprising the step of positioning said microprocessor into a general purpose computer.

15. A method of designing a dedicated logic region of an integrated circuit, said method comprising the steps of:

specifying a bipolar logic stage with a common emitter line positioned along an axis, and a plurality of bipolar logic blocks arranged along said axis, each of said bipolar logic blocks including a bipolar logic gate with an emitter connected to said common emitter line, each of said bipolar logic blocks further including an emitter-base reverse voltage protection device; and establishing a CMOS logic stage including a plurality of CMOS logic blocks connected to said plurality of bipolar logic blocks, said CMOS logic stage performing logical operations on a set of input signals to generate a set of intermediate signals that are driven by said plurality of bipolar signal drive blocks onto said common emitter line that executes a hardwired logical OR operation on said intermediate signals to produce a high speed output signal.

16. The method of claim 15 further comprising the step of integrating said dedicated logic region into a microprocessor.

* * * * *